(12) United States Patent
Padiyath et al.

(10) Patent No.: US 8,034,452 B2
(45) Date of Patent: Oct. 11, 2011

(54) MOISTURE BARRIER COATINGS

(75) Inventors: Raghunath Padiyath, Woodbury, MN (US); Moses M. David, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 13/024,521

(22) Filed: Feb. 10, 2011

(65) Prior Publication Data

US 2011/0143129 A1    Jun. 16, 2011

Related U.S. Application Data

(60) Continuation of application No. 12/400,431, filed on Mar. 9, 2009, now abandoned, which is a division of application No. 11/185,078, filed on Jul. 20, 2005, now abandoned.

(51) Int. Cl.
*B32B 9/00* (2006.01)

(52) U.S. Cl. ......... 428/408; 428/332; 428/336; 428/446

(58) Field of Classification Search .................. 428/332, 428/336, 408, 446
See application file for complete search history.

(56) References Cited

U.S. PATENT DOCUMENTS

| | | |
|---|---|---|
| 4,696,719 A | 9/1987 | Bischoff |
| 4,722,515 A | 2/1988 | Ham |
| 4,791,012 A | 12/1988 | d'Agostino et al. |
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,097,800 A | 3/1992 | Shaw et al. |
| 5,125,138 A | 6/1992 | Shaw et al. |
| 5,320,875 A | 6/1994 | Hu et al. |
| 5,352,493 A | 10/1994 | Dorfman et al. |
| 5,440,446 A | 8/1995 | Shaw et al. |
| 5,494,712 A | 2/1996 | Hu et al. |
| 5,508,368 A | 4/1996 | Knapp et al. |
| 5,530,581 A | 6/1996 | Cogan |
| 5,547,908 A | 8/1996 | Furuzawa et al. |
| 5,618,619 A | 4/1997 | Petrmichl et al. |
| 5,638,251 A | 6/1997 | Goel et al. |
| 5,652,067 A | 7/1997 | Ito et al. |
| 5,679,413 A | 10/1997 | Petrmichl et al. |
| 5,681,666 A | 10/1997 | Treger et al. |
| 5,682,043 A | 10/1997 | Pei et al. |
| 5,686,360 A | 11/1997 | Harvey, III et al. |
| 5,693,956 A | 12/1997 | Shi et al. |
| 5,718,976 A | 2/1998 | Dorfman et al. |
| 5,736,207 A | 4/1998 | Walther et al. |

(Continued)

FOREIGN PATENT DOCUMENTS

DE    04220251    1/1993

(Continued)

OTHER PUBLICATIONS

ASTM F-1249-05, ASTM International, West Conshohocken, PA, United States, 2005, pp. 1-5.

(Continued)

*Primary Examiner* — Archene Turner

(57) ABSTRACT

A barrier assembly having a flexible or rigid substrate overcoated with an all polymer multilayer stack. A multilayer on the substrate includes alternating diamond-like glass or carbon layers with polymer layers. Another multilayer includes alternating polymer layers using different types of polymers. The barrier layers can be used to mount, cover, encapsulate or form composite assemblies for protection of moisture or oxygen sensitive articles.

25 Claims, 2 Drawing Sheets

U.S. PATENT DOCUMENTS

| | | |
|---|---|---|
| 5,757,126 A | 5/1998 | Harvey, III et al. |
| 5,811,177 A | 9/1998 | Shi et al. |
| 5,877,895 A | 3/1999 | Shaw et al. |
| 5,888,594 A | 3/1999 | David et al. |
| 5,902,641 A | 5/1999 | Affinito et al. |
| 5,920,080 A | 7/1999 | Jones |
| 6,004,660 A | 12/1999 | Topolski et al. |
| 6,010,751 A | 1/2000 | Shaw et al. |
| 6,045,864 A | 4/2000 | Lyons et al. |
| 6,083,313 A | 7/2000 | Venkatraman et al. |
| 6,083,628 A | 7/2000 | Yializis |
| 6,146,225 A | 11/2000 | Sheats et al. |
| 6,198,217 B1 | 3/2001 | Suzuki et al. |
| 6,198,220 B1 | 3/2001 | Jones et al. |
| 6,200,675 B1 | 3/2001 | Neerinck et al. |
| 6,214,422 B1 | 4/2001 | Yializis |
| 6,231,939 B1 | 5/2001 | Shaw et al. |
| 6,268,695 B1 | 7/2001 | Affinito |
| 6,358,570 B1 | 3/2002 | Affinito |
| 6,379,757 B1 | 4/2002 | Iacovangelo |
| 6,413,645 B1 | 7/2002 | Graff et al. |
| 6,429,584 B2 | 8/2002 | Kubota |
| 6,432,494 B1 | 8/2002 | Yang et al. |
| 6,465,953 B1 | 10/2002 | Duggal |
| 6,492,026 B1 | 12/2002 | Graff et al. |
| 6,497,598 B2 | 12/2002 | Affinito |
| 6,522,067 B1 | 2/2003 | Graff et al. |
| 6,570,325 B2 | 5/2003 | Graff et al. |
| 6,623,861 B2 | 9/2003 | Martin et al. |
| 6,624,568 B2 | 9/2003 | Silvernail |
| 6,630,243 B2 | 10/2003 | Valint, Jr. et al. |
| 6,630,980 B2 | 10/2003 | Sobrinho |
| 6,669,996 B2 | 12/2003 | Ueno et al. |
| 6,696,157 B1 | 2/2004 | David et al. |
| 6,743,524 B2 | 6/2004 | Schaepkens |
| 6,777,249 B2 | 8/2004 | Yamazaki |
| 6,849,877 B2 | 2/2005 | Yamazaki et al. |
| 6,897,474 B2 | 5/2005 | Brown et al. |
| 6,911,067 B2 | 6/2005 | Kolics et al. |
| 6,911,667 B2 | 6/2005 | Pichler et al. |
| 6,933,538 B2 | 8/2005 | Hunze et al. |
| 6,957,067 B1 | 10/2005 | Iyer et al. |
| 6,975,967 B2 | 12/2005 | Elwood et al. |
| 7,015,640 B2 | 3/2006 | Schaepkens et al. |
| 7,030,557 B2 | 4/2006 | Su et al. |
| 7,038,374 B2 | 5/2006 | Yamazaki et al. |
| 7,086,918 B2 | 8/2006 | Hsiao et al. |
| 7,342,356 B2 | 3/2008 | McCormick et al. |
| 7,642,372 B2 | 1/2010 | Smith |
| 2001/0052752 A1 | 12/2001 | Ghosh et al. |
| 2002/0022156 A1 | 2/2002 | Bright |
| 2002/0093285 A1 | 7/2002 | Sugimoto et al. |
| 2002/0125822 A1 | 9/2002 | Graff et al. |
| 2002/0153523 A1 | 10/2002 | Bernius et al. |
| 2003/0089905 A1 | 5/2003 | Udagawa |
| 2003/0099858 A1 | 5/2003 | Duggal et al. |
| 2003/0164497 A1 | 9/2003 | Carcia et al. |
| 2004/0027061 A1 | 2/2004 | Seo |
| 2004/0053431 A1 | 3/2004 | Chang et al. |
| 2004/0056269 A1 | 3/2004 | Chen |
| 2004/0119068 A1 | 6/2004 | Weaver |
| 2004/0195967 A1 | 10/2004 | Padiyath et al. |
| 2004/0197944 A1 | 10/2004 | Chen et al. |
| 2004/0229051 A1 | 11/2004 | Schaepkens et al. |
| 2004/0241454 A1 | 12/2004 | Shaw |
| 2005/0030264 A1 | 2/2005 | Tsuge |
| 2005/0041193 A1 | 2/2005 | Lifka et al. |
| 2005/0146267 A1 | 7/2005 | Lee et al. |
| 2005/0179379 A1 | 8/2005 | Kim |
| 2005/0202646 A1 | 9/2005 | Burrows et al. |
| 2005/0239294 A1 | 10/2005 | Rosenblum et al. |
| 2005/0269943 A1 | 12/2005 | Hack et al. |
| 2005/0287686 A1 | 12/2005 | Won |
| 2006/0017055 A1 | 1/2006 | Cropper et al. |
| 2006/0061272 A1 | 3/2006 | McCormick et al. |
| 2006/0063015 A1 | 3/2006 | McCormick et al. |
| 2006/0078677 A1 | 4/2006 | Won et al. |
| 2006/0158101 A1 | 7/2006 | Camilletti et al. |
| 2006/0273304 A1 | 12/2006 | Cok |

FOREIGN PATENT DOCUMENTS

| | | |
|---|---|---|
| DE | 19715054 | 10/1998 |
| EP | 0241739 | 10/1987 |
| EP | 0 977 469 | 2/2000 |
| EP | 1191819 | 3/2002 |
| JP | 1997123334 | 5/1997 |
| JP | 2000-223264 | 8/2000 |
| JP | 2001-326071 | 11/2001 |
| JP | 2003-51383 | 2/2003 |
| WO | WO 97/16053 | 5/1997 |
| WO | WO 00/26973 | 5/2000 |
| WO | WO 00/36665 | 6/2000 |
| WO | WO 01/66820 | 9/2001 |
| WO | WO 01/83290 | 11/2001 |
| WO | WO 01/89006 | 11/2001 |
| WO | WO 02/065558 | 8/2002 |
| WO | WO 03/066665 | 8/2003 |
| WO | WO 2004/013336 | 2/2004 |
| WO | WO 2004/054010 | 6/2004 |
| WO | WO 2004/079781 | 9/2004 |
| WO | WO 2005/029601 | 3/2005 |
| WO | WO 2005/048367 | 5/2005 |

OTHER PUBLICATIONS

H. Yasuda, *Plasma Polymerization*, Academic Press Inc., New York (1985), pp. ix and 1-10.

R. d'Agostino (ed), *Plasma Deposition, Treatment & Etching of Polymers*, Academic Press, New York (1990), pp. 1-93.

H. Biederman and Y. Osada, *Plasma Polymerization Processes*, Elsevier, New York (1992), pp. 1-7.

D. G. Shaw and M. G. Langlois, "A New Vapor Deposition Process for Coating Paper and Polymer Webs," 6th International Vacuum Coating Conference (1992), pp. 96-102.

D. G. Shaw and M. G. Langlois, "A New High Speed Process for Vapor Depositing Acrylate Thin Films: An Update," Society of Vacuum Coaters 36th Annual Technical Conference Proceedings, (1993), 1-878068-12-1, pp. 348-351.

D. G. Shaw and M. G. Langlois, "Use of Vapor Deposited Acrylate Coatings to Improve the Barrier Properties of Metallized Film," Society of Vacuum Coaters 37th Annual Technical Conference Proceedings (1994), 1-878-068-13-X, pp. 240-247.

D. G. Shaw, M. Roehrig, M. G. Langlois and C. Sheehan, "Use of Evaporated Acrylate Coatings to Smooth the Surface of Polyester and Polypropylene Film and Aluminum Substrates," RadTech (1996), pp. 701-707.

J. Affinito, P. Martin, M. Gross, C. Coronado and E. Greenwell, "Vacuum deposited polymer/metal multilayer films for optical application," Thin Solid Films 270, (1995), pp. 43-48.

J. D. Affinito, M. E. Gross, C. A. Coronado, G. L. Graff, E. N. Greenwell and P. M. Martin, "Polymer-Oxide Transparent Barrier Layers," Society of Vacuum Coaters 39th Annual Technical Conference Proceedings (1996), ISSN 0737-5921, pp. 392-397.

McCormick, Fred B. et al., U.S. Appl. No. 10/948,011, "Organic Electroluminescent Device," filed Sep. 23, 2004.

McCormick, Fred B. et al., U.S. Appl. No. 10/948,013, "Protected Polymeric Film," filed Sep. 23, 2004.

Tajima, N., et al. "First-Principle Moleculat Model of PECVD SiOCH Film for the Mechanical and Dielectric Property Investigation." Proceedings of the IEEE 2005 International Interconnect Technology Conference (Jun. 6-8, 2005): pp. 66-68.

Bosch, F., et al. "Sorption and Permeation Characteristics of Hybrid Organosilicon thin films deposited by PECV." Sep. Pur. Technol., vol. 32 (2003): pp. 371-376.

MOISTURE BARRIER COATINGS

CROSS REFERENCE TO RELATED APPLICATIONS

This application is a continuation of U.S. Ser. No. 12/400,431, filed Mar. 9, 2009, now abandoned, which is a divisional of U.S. Ser. No. 11/185,078, filed Jul. 20, 2005, abandoned, the disclosures of which are incorporated by reference in their entirety herein.

FIELD OF INVENTION

The present invention relates to barrier films for protection of moisture or oxygen sensitive articles.

BACKGROUND

Organic light emitting devices (OLEDs) can suffer reduced output or premature failure when exposed to water vapor or oxygen. Metals and glasses have been used to encapsulate and prolong the life of OLED devices, but metals typically lack transparency and glass lacks flexibility. Intense efforts are underway to find alternative encapsulation materials for OLEDs and other electronic devices. Examples include various types of vacuum processes are described in the patent and technical literature for the formation of barrier coatings. These methods span the range of e-beam evaporation, thermal evaporation, electron-cyclotron resonance plasma-enhanced chemical vapor deposition (PECVD), magnetically enhanced PECVD, reactive sputtering, and others. Barrier performance of the coatings deposited by these methods typically results in a moisture vapor transmission rate (MVTR) in the range from 0.1-5 g/m$^2$ day, depending on the specific processes. Graff (WO0036665) demonstrates the importance of separating multiple inorganic oxide coatings with vapor deposited highly cross-linked polymer layers to achieve barrier performance necessary for OLED device substrates.

It is commonly accepted that multiple inorganic layers separated by polymer coatings are needed to achieve superior barrier performance. U.S. Pat. No. 5,320,875 teaches the importance of a plasma polymerized siloxane monomer and an adhesion promoter in addition to generating the plasma in an "oxygen excessive" mode and depositing the coatings in the "plasma reaction zone" to obtain improved barrier performance. The best barrier coatings made by this process still have an MVTR of 0.23 g/m$^2$ day. Da Silva Sobrinho et al. (Surface and Coatings Technology, 116-119, p 1204, 1999) report a microwave and radio frequency combined process for depositing barrier coatings. In U.S. Pat. No. 6,146,225, Sheats et al. claim that a high density plasma with low bias voltage results in superior quality barrier coatings.

References relating to flexible barrier films include U.S. Pat. No. 5,440,446 (Shaw et. al.), U.S. Pat. No. 5,530,581 (Cogan), U.S. Pat. No. 5,681,666 (Treger et al.), U.S. Pat. No. 5,686,360 (Harvey, III et al.), U.S. Pat. No. 5,736,207 (Walther et al.), U.S. Pat. No. 6,004,660 (Topolski et al.), U.S. Pat. No. 6,083,628 (Yializis), U.S. Pat. No. 6,146,225 (Sheats et al.), U.S. Pat. No. 6,214,422 (Yializis), U.S. Pat. No. 6,268,695 (Affinito), U.S. Pat. No. 6,358,570 (Affinito), U.S. Pat. No. 6,413,645 (Graff et al.), U.S. Pat. No. 6,492,026 (Graff et al.), U.S. Pat. No. 6,497,598 (Affinito), U.S. Pat. No. 6,497,598 (Affinito), U.S. Pat. No. 6,623,861 (Martin et al.), U.S. Pat. No. 6,570,325 (Graff et al.), U.S. Pat. No. 5,757,126, U.S. Patent Application No. 2002/0125822 A1 (Graff et al.), and PCT Published Application No. WO 97/16053 (Robert Bosch GmbH).

SUMMARY OF INVENTION

A first composite assembly for protection of a moisture or oxygen sensitive article includes a substrate, a first polymer layer overcoated on the substrate, and a second polymer layer overcoated on the first polymer layer. In this assembly, the first polymer layer is composed of a first polymer and the second polymer layer is composed of a second polymer different from the first polymer, and the second polymer comprises a plasma polymer.

A second composite assembly for protection of a moisture or oxygen sensitive article includes a substrate, a polymer layer overcoated on the substrate, and a diamond-like carbon layer overcoated on the polymer layer.

A third composite assembly for protection of a moisture or oxygen sensitive article includes a substrate, a polymer layer overcoated on the substrate, and a diamond-like glass layer overcoated on the polymer glass layer.

Processes include any method of fabricating these assemblies.

The words of orientation such as "atop", "on", "uppermost" and the like for the location of various layers in the barrier assemblies or devices refer to the relative position of one or more layers with respect to a horizontal support layer. We do not intend that the barrier assemblies or devices should have any particular orientation in space during or after their manufacture.

The term "overcoated" to describe the position of a layer with respect to a substrate or other element of a barrier assembly, refers to the layer as being atop the substrate or other element, but not necessarily contiguous to either the substrate or the other element.

The term "polymer" refers to homopolymers and copolymers, as well as homopolymers or copolymers that may be formed in a miscible blend, e.g., by coextrusion or by reaction, including, e.g., transesterification. The term "polymer" also includes plasma deposited polymers. The term "copolymer" includes both random and block copolymers. The term "curable polymer" includes both crosslinked and uncrosslinked polymers. The term "crosslinked" polymer refers to a polymer whose polymer chains are joined together by covalent chemical bonds, usually via crosslinking molecules or groups, to form a network polymer. A crosslinked polymer is generally characterized by insolubility, but may be swellable in the presence of an appropriate solvent.

The term a "visible light-transmissive" support, layer, assembly or device means that the support, layer, assembly or device has an average transmission over the visible portion of the spectrum, T$_{vis}$, of at least about 20%, measured along the normal axis.

The term "diamond-like glass" (DLG) refers to substantially or completely amorphous glass including carbon and silicon, and optionally including one or more additional components selected from the group including hydrogen, nitrogen, oxygen, fluorine, sulfur, titanium, and copper. Other elements may be present in certain embodiments. The amorphous diamond-like glass films may contain clustering of atoms to give it a short-range order but are essentially void of medium and long range ordering that lead to micro or macro crystallinity which can adversely scatter radiation having wavelengths of from 180 nanometers (nm) to 800 nm.

The term "diamond-like carbon" (DLC) refers to an amorphous film or coating comprising approximately 50 to 90 atomic percent carbon and approximately 10 to 50 atomic percent hydrogen, with a gram atom density of between approximately 0.20 and approximately 0.28 gram atoms per cubic centimeter, and composed of approximately 50% to approximately 90% tetrahedral bonds.

BRIEF DESCRIPTION OF THE DRAWINGS

The invention may be more completely understood in the following detailed description of various embodiments of the invention in connection with the accompanying drawings, in which.

DETAILED DESCRIPTION

Figure 1:
FIG. 1 is a schematic view of a disclosed barrier assembly.

Embodiments consistent with the present invention include an enhanced PECVD process that leads to coatings having superior moisture vapor barrier performance. In one particular embodiment, excellent barrier performance is achieved from a SiOCH film formed on a web in intimate contact with a drum electrode utilizing radio frequency (RF) plasma conditions that lead to an oxygen depleted silicon oxide coating under significant energetic ion bombardment. The MVTRs of barrier coatings deposited using this process were less than 0.005 g/m$^2$ day measured using ASTM F-1219 at 50° C. According to certain embodiments, barrier coatings at least 100 nm thick deposited under high self-bias and low pressures (approximately 5-10 mTorr) result in superior moisture vapor transmission rates. The coatings are deposited on a drum electrode powered using an RF source operating at least 1000 W of forward power. The vacuum chamber is configured such that these operating conditions result in a very high (>500 V) negative potential on the drum electrode. As a result of ion bombardment from having high substrate bias, the coating formed has very low free volume. The drum is typically water cooled. A silicon source such as tetra methyl silane (TMS) and oxygen is introduced in quantities such that the resulting coatings are oxygen depleted in certain embodiments. Even though the coatings are deficient in oxygen, the coatings have high optical transmission. Nitrogen may be introduced in addition to oxygen to obtain a SiOCNH coating. The SiOCNH coatings also have superior barrier properties.

Therefore, the process conditions that result in better barrier coatings are as follows: (1) barrier coatings are made by an RF PECVD process on a moving drum electrode under high self-bias; (2) the CVD process is operated at a very low pressure of less than 50 mTorr, preferably less than 25 mTorr, most preferably less than 10 mTorr to avoid gas phase nucleation and particle formation, and to prevent collisional quenching of ion energy at higher pressures; and (3) the coatings are significantly "oxygen depleted," meaning that for every Si atom there are less than 1.5 oxygen atoms present in the coating (O/Si atomic ratio<1.5).

The barrier coatings may be used for various types of packaging applications. For example, electronics, medical, pharmaceutical and foodstuffs packaging all have varying requirements for protection from moisture and oxygen. For pharmaceuticals, the barrier coatings may be used, for example, to protect drugs from oxygen and moisture, helping to maintain their purity and increase their shelf life by avoiding the adverse effects of contaminants. For foodstuffs, the barrier coatings may be used, for example, to protect food products from oxygen and moisture, helping to preserve their flavor and increase their shelf life. Another application involves using the coatings to encapsulate phosphor particles including electroluminescent phosphor particles such as zinc sulfide, organic electroluminescent thin films, photovoltaic devices, and other such devices. Substrates having the barrier coatings may be used in the fabrication of flexible electronic devices such as OLEDs, organic transistors, liquid crystal displays (LCD), and other devices. The coatings can also be used to encapsulate the OLED devices directly, and the barrier film could be used as a cover for encapsulating glass or plastic substrate devices. Due to the superior barrier performance of the coatings produced using the described PECVD conditions, such devices could be produced at a lower cost with better performance.

Exemplary Barrier Assembly Structures

FIG. 1 is a schematic view of a disclosed barrier assembly having a coating 100 to reduce or prevent substantial transfer of moisture and oxygen, or other contaminants, to an underlying substrate 102. The assembly can represent any type of article requiring or benefiting from protection from moisture or oxygen, such as the examples provided above. For certain types of electronic or display devices, for example, oxygen and moisture can severely degrade their performance or lifetime, and thus the coating 100 can provide significant advantages in device performance.

Figure 2:
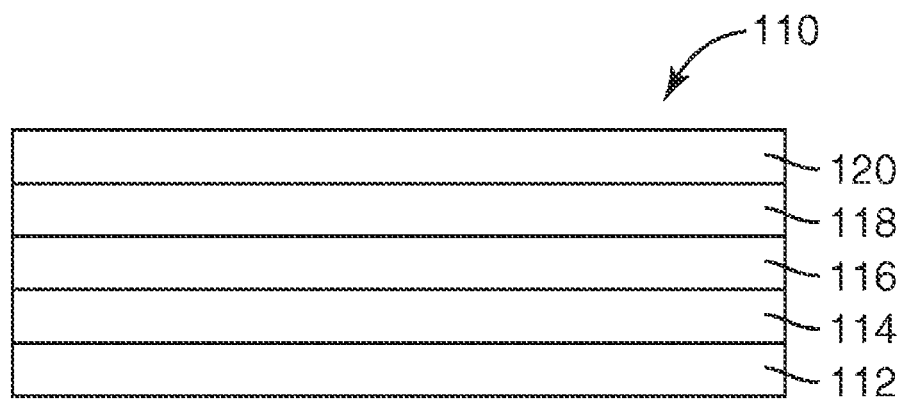
FIG. 2 is a schematic view of a disclosed barrier assembly having multiple layers made from alternating DLG or DLC layers and polymer layers.
Figure 3:
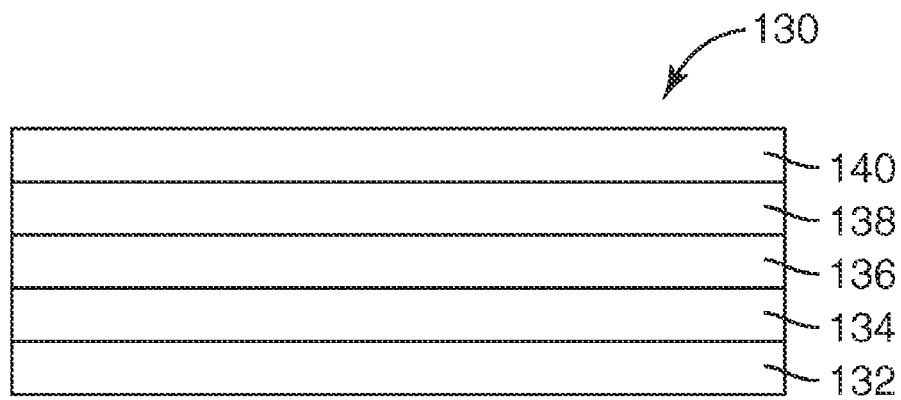
FIG. 3 is a schematic view of a disclosed laminated barrier assembly having multiple layers made from polymers.

FIG. 2 is a schematic view of a disclosed laminated barrier assembly 110 having multiple layers made from alternating DLG or DLC layers 116, 120 and polymer layers 114, 118 protecting an underlying substrate 112. FIG. 3 is a schematic view of a disclosed laminated barrier assembly 130 having multiple layers made from alternating different types of polymer layers, for example alternating polymer layers 136, 140 and polymer layers 134, 138 protecting an underlying substrate 132. In this example, layers 136 and 140 are composed of a first type of polymer, and layers 134 and 138 are composed of a second type of polymer different from the first type of polymer. Any highly crosslinked polymers may be used for the layers, examples of which are provided below. Assembly 130, in one embodiment, is thus an all polymer multilayer construction of a barrier assembly, although it can also include other types of layers. Each group of different polymers (e.g., 134 and 136), or combinations of polymers including DLG or DLC (e.g., 114 and 116), are referred to as a dyad, and the assembly can include any number of dyads. It can also include various types of optional layers between the dyads, examples of which are provided below.

Assemblies 110 and 130 can include any number of alternating or other layers. Adding more layers may improve the lifetime of the assemblies by increasing their imperviousness to oxygen, moisture, or other contaminants. Use of more or multiple layers may also help cover or encapsulate defects within the layers. The number of layers can be optimized, or otherwise selected, based upon particular implementations or other factors.

Substrate

Substrates having moisture barrier coatings can include any type of substrate material for use in making a display or electronic device. The substrate can be rigid, for example by using glass or other materials. The substrate can also be curved or flexible, for example by using plastics or other materials. The substrate can be of any desired shape. Particularly preferred supports are flexible plastic materials including thermoplastic films such as polyesters (e.g., PET), polyacrylates (e.g., polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide, and thermoset films such as cellulose derivatives, polyimide, polyimide benzoxazole, and poly benzoxazole.

Other suitable materials for the substrate include chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifluoroethylene (PCTFE), perfluoroalkyl-tetrafluoroethylene copolymer (PFA), polytetrafluoroethyloene (PTFE), polyvinylidene fluoride (PVDF), polyvinyl fluoride (PVF), tetrafluoroethylene-hexafluoropropylene copolymer (TFE/HFP), tetrafluoroethylene-hexafluoropropylene-vinylidene fluoride terpolymer (THV), polychlorotrifluoroethylene (PCTFE), hexafluoropropylene-vinylidene fluoride copolymer (HFP/VDF), tetrafluoroethylene-propylene copolymer (TFE/P), and tetrafluoroethylene-perfluoromethylether copolymer (TFE/PFMe).

Alternative substrates include materials having a high glass transition temperature (Tg) barrier, preferably being heat-stabilized, using heat setting, annealing under tension, or other techniques that will discourage shrinkage up to at least the heat stabilization temperature when the support is not constrained. If the support has not been heat stabilized, then it preferably has a Tg greater than that of polymethyl methacrylate (PMMA, Tg=105° C.). More preferably the support has a Tg of at least about 110° C., yet more preferably at least about 120° C., and most preferably at least about 128° C. In addition to heat-stabilized polyethylene terephthalate (HSPET), other preferred supports include other heat-stabilized high Tg polyesters, PMMA, styrene/acrylonitrile (SAN, Tg=110° C.), styrene/maleic anhydride (SMA, Tg=115° C.), polyethylene naphthalate (PEN, Tg=about 120° C.), polyoxymethylene (POM, Tg=about 125° C.), polyvinylnaphthalene (PVN, Tg=about 135° C.), polyetheretherketone (PEEK, Tg=about 145° C.), polyaryletherketone (PAEK, Tg=145° C.), high Tg fluoropolymers (e.g., DYNEON™ HTE terpolymer of hexafluoropropylene, tetrafluoroethylene, and ethylene, Tg=about 149° C.), polycarbonate (PC, Tg=about 150° C.), poly alpha-methyl styrene (Tg=about 175° C.), polyarylate (PAR, Tg=190° C.), polysulfone (PSul, Tg=about 195° C.), polyphenylene oxide (PPO, Tg=about 200° C.), polyetherimide (PEI, Tg=about 218° C.), polyarylsulfone (PAS, Tg=220° C.), poly ether sulfone (PES, Tg=about 225° C.), polyamide-imide (PAI, Tg=about 275° C.), polyimide (Tg=about 300° C.) and polyphthalamide (heat deflection temp of 120° C.). For applications where material costs are important, supports made of HSPET and PEN are especially preferred. For applications where barrier performance is paramount, supports made of more expensive materials may be employed. Preferably the substrate has a thickness of about 0.01 millimeters (mm) to about 1 mm, more preferably about 0.05 mm to about 0.25 mm.

DLG Layer

Diamond-like glass is an amorphous carbon system including a substantial quantity of silicon and oxygen that exhibits diamond-like properties. In these films, on a hydrogen-free basis, there is at least 30% carbon, a substantial amount of silicon (typically at least 25%) and no more than 45% oxygen. The unique combination of a fairly high amount of silicon with a significant amount of oxygen and a substantial amount of carbon makes these films highly transparent and flexible (unlike glass).

Diamond-like glass thin films may have a variety of light transmissive properties. Depending upon the composition, the thin films may have increased transmissive properties at various frequencies. However, in specific implementations the thin film (when approximately one micron thick) is at least 70% transmissive to radiation at substantially all wavelengths from about 250 nm to about 800 nm and more preferably from about 400 nm to about 800 nm. The extinction coefficient of DLG film is as follows: 70% transmission for a one micron thick film corresponds to an extinction coefficient (k) of less than 0.02 in the visible wavelength range between 400 nm and 800 nm.

Diamond thin films, having significantly different properties from the amorphous diamond-like glass film of the present invention due to the arrangement and intermolecular bonds of carbon atoms in the specific material, have previously been deposited on substrates. The type and amount of intermolecular bonds are determined by infrared (IR) and nuclear magnetic resonance (NMR) spectra. Carbon deposits contain substantially two types of carbon-carbon bonds: trigonal graphite bonds ($sp^2$) and tetrahedral diamond bonds ($sp^3$). Diamond is composed of virtually all tetrahedral bonds, while diamond-like films are composed of approximately 50% to 90% tetrahedral bonds, and graphite is composed of virtually all trigonal bonds.

The crystallinity and the nature of the bonding of the carbon system determine the physical and chemical properties of the deposit. Diamond is crystalline whereas the diamond-like glass is a non-crystalline amorphous material, as determined by x-ray diffraction. Diamond is essentially pure carbon, whereas diamond-like glass contains a substantial amount of non-carbon components, including silicon.

Diamond has the highest packing density, or gram atom density (GAD) of any material at ambient pressure. Its GAD is 0.28 gram atoms/cc. Amorphous diamond-like films have a GAD ranging from about 0.20 to 0.28 gram atoms/cc. In contrast, graphite has a GAD of 0.18 gram atoms/cc. The high packing density of diamond-like glass affords excellent resistance to diffusion of liquid or gaseous materials. Gram atom density is calculated from measurements of the weight and thickness of a material. The term "gram atom" refers to the atomic weight of a material expressed in grams.

Amorphous diamond-like glass is diamond-like because, in addition to the foregoing physical properties that are similar to diamond, it has many of the desirable performance properties of diamond such as extreme hardness (typically 1000 to 2000 kg/mm$^2$), high electrical resistivity (often $10^9$ to $10^{13}$ ohm-cm), a low coefficient of friction (for example, 0.1), and optical transparency over a wide range of wavelengths (a typical extinction coefficient of about between 0.01 and 0.02 in the 400 nm to 800 nm range).

Diamond films also have some properties which, in many applications, make them less beneficial than amorphous diamond-like glass films. Diamond films usually have grain structures, as determined by electron microscopy. The grain boundaries are a path for chemical attack and degradation of the substrates, and also cause scattering of actinic radiation. Amorphous diamond-like glass does not have a grain structure, as determined by electron microscopy, and is thus well suited to applications wherein actinic radiation will pass through the film. The polycrystalline structure of diamond films causes light scattering from the grain boundaries.

In creating a diamond-like glass film, various additional components can be incorporated into the basic carbon or carbon and hydrogen composition. These additional components can be used to alter and enhance the properties that the diamond-like glass film imparts to the substrate. For example, it may be desirable to further enhance the barrier and surface properties.

The additional components may include one or more of hydrogen (if not already incorporated), nitrogen, fluorine, sulfur, titanium, or copper. Other additional components may also be of benefit. The addition of hydrogen promotes the formation of tetrahedral bonds. The addition of fluorine is particularly useful in enhancing barrier and surface properties of the diamond-like glass film, including the ability to be dispersed in an incompatible matrix. The addition of nitrogen may be used to enhance resistance to oxidation and to increase electrical conductivity. The addition of sulfur can enhance adhesion. The addition of titanium tends to enhance adhesion as well as diffusion and barrier properties.

These diamond-like materials may be considered as a form of plasma polymers, which can be deposited on the assembly using, for example, a vapor source. The term "plasma polymer" is applied to a class of materials synthesized from a plasma by using precursor monomers in the gas phase at low temperatures. Precursor molecules are broken down by energetic electrons present in the plasma to form free radical species. These free radical species react at the substrate surface and lead to polymeric thin film growth. Due to the non-specificity of the reaction processes in both the gas phase and the substrate, the resulting polymer films are highly cross-linked and amorphous in nature. This class of materials has been researched and summarized in publications such as the following: H. Yasuda, "Plasma Polymerization," Academic Press Inc., New York (1985); R. d'Agostino (Ed), "Plasma Deposition, Treatment & Etching of Polymers," Academic Press, New York (1990); and H. Biederman and Y. Osada, "Plasma Polymerization Processes," Elsever, New York (1992).

Typically, these polymers have an organic nature to them due to the presence of hydrocarbon and carbonaceous functional groups such as $CH_3$, $CH_2$, $CH$, $Si—C$, $Si—CH_3$, $Al—C$, $Si—O—CH_3$, etc. The presence of these functional groups may be ascertained by analytical techniques such as IR, nuclear magnetic resonance (NMR) and secondary ion mass (SIMS) spectroscopies. The carbon content in the film may be quantified by electron spectroscopy for chemical analysis (ESCA).

Not all plasma deposition processes lead to plasma polymers. Inorganic thin films are frequently deposited by PECVD at elevated substrate temperatures to produce thin inorganic films such as amorphous silicon, silicon oxide, silicon nitride, aluminum nitride, etc. Lower temperature processes may be used with inorganic precursors such as silane ($SiH_4$) and ammonia ($NH_3$). In some cases, the organic component present in the precursors is removed in the plasma by feeding the precursor mixture with an excess flow of oxygen. Silicon rich films are produced frequently from tetramethyldisiloxane (TMDSO)-oxygen mixtures where the oxygen flow rate is ten times that of the TMDSO flow. Films produced in these cases have an oxygen to silicon ratio of about 2, which is near that of silicon dioxide.

The plasma polymer layer of this invention is differentiated from other inorganic plasma deposited thin films by the oxygen to silicon ratio in the films and by the amount of carbon present in the films. When a surface analytic technique such as ESCA is used for the analysis, the elemental atomic composition of the film may be obtained on a hydrogen-free basis. Plasma polymer films of the present invention are substantially sub-stoichiometric in their inorganic component and substantially carbon-rich, depicting their organic nature. In films containing silicon for example, the oxygen to silicon ratio is preferably below 1.8 (silicon dioxide has a ratio of 2.0), and most preferably below 1.5 as in the case of DLG, and the carbon content is at least about 10%. Preferably, the carbon content is at least about 20% and most preferably at least about 25%. Furthermore, the organic siloxane structure of the films may be detected by IR spectra of the film with the presence of $Si—CH_3$ groups at $1250 \text{ cm}^{-1}$ and $800 \text{ cm}^{-1}$, and by secondary ion mass spectroscopy (SIMS).

One advantage of DLG coatings or films is their resistance to cracking in comparison to other films. DLG coatings are inherently resistant to cracking either under applied stress or inherent stresses arising from manufacture of the film. This property was determined by cutting 75 mm×10 mm strips of sample #2 prepared according to the process conditions in Table 2 of Example 1 below (175 nm thick DLG coating) and sample #1 prepared according to the conditions described in Table 3 of Example 1 below (60 nm thick sputtered SiOx film). The strips were attached to the jaws of a home-made vise. The extent of travel of the jaws was determined by a digital micrometer attached to the vise. The sample strips were stretched by opening the jaws by 1.5 mm thus producing a 2% elongation in the coated samples. The stretched samples were placed under a microscope and number of cracks in the coating were counted. The results are provided in Table 1. It can be seen that the number of cracks is substantially lower for the DLG film even though its thickness is almost three times that of the sputtered SiOx film, contrary to the generally expected result that a thicker film would result in a greater tendency to crack.

TABLE 1

|  | Thickness | Number of cracks/mm after 2% stretch |
|---|---|---|
| DLG film | 175 nm | 52 |
| Sputtered film | 60 nm | 84 |

DLC Layer

Diamond and DLC differ significantly due to the arrangement of carbon atoms in the specific material. Carbon coatings contain substantially two types of carbon-carbon bonds: trigonal graphite bonds ($sp^2$) and tetrahedral diamond bonds ($sp^3$). Diamond is composed of virtually all tetrahedral bonds, DLC is composed of approximately 50% to 90% tetrahedral bonds, and graphite is composed of virtually all trigonal bonds. The type and amount of bonds are determined from IR and nuclear magnetic resonance (NMR) spectra.

The crystallinity and the nature of the bonding of the carbon determine the physical and chemical properties of the coating. Diamond is crystalline whereas DLC is a non-crystalline amorphous material, as determined by x-ray diffraction. DLC contains a substantial amount of hydrogen (from 10 to 50 atomic percent), unlike diamond which is essentially pure carbon. Atomic percentages are determined by combustion analysis.

Diamond has the highest packing, or gram atom, density (GAD) of any material at ambient pressure. Its GAD is 0.28 gram atoms/cc. Diamond-like carbon has a GAD ranging from about 0.20 to 0.28 gram atoms/cc. In contrast, graphite has a GAD of 0.18 gram atoms/cc. The high packing density of DLC affords it excellent resistance to diffusion of liquid or gaseous materials.

DLC coatings are diamond-like because, in addition to the foregoing physical properties that are similar to diamond, they have many of the desirable properties of diamond such as extreme hardness (1000 to 2000 $kg/mm^2$), high electrical resistivity ($10^9$ to $10^{13}$ ohm-cm), a low coefficient of friction (0.1), and optical transparency over a wide range of wavelengths (extinction coefficient of less than 0.1 in the 400 to 800 nanometer range).

However, diamond coatings have some properties which, in some applications, make them less beneficial as a coating than DLC. Diamond coatings are comprised of a grain structures, as determined by electron microscopy. The grain boundaries are a path for chemical attack and degradation of underlying sensitive materials, via transmission of water or oxygen. The amorphous DLC coatings do not have a grain structure, as determined by electron microscopy.

Diamond and DLC also have different light absorption characteristics. For example, diamond has no intrinsic fundamental absorption in the blue light range because its optical band gap is 5.56 eV and it is transmissive well into the ultraviolet region. DLC, on the other hand, contains small amounts of unsaturated bonds due to carbon-carbon double bonding, which causes an optical absorption band in the blue region of the electromagnetic spectrum.

Various additives to the DLC coating can be used. These additives may comprise one or more of nitrogen, oxygen, fluorine, or silicon. The addition of fluorine is particularly useful in enhancing barrier and surface properties, including dispersibility, of the DLC coating. Sources of fluorine include compounds such as carbon tetrafluoride ($CF_4$), sulfur hexafluoride ($SF_6$), $C_2F_6$, $C_3F_8$, and $C_4F_{10}$. The addition of silicon and oxygen to the DLC coating tend to improve the optical transparency and thermal stability of the coating. The addition of nitrogen may be used to enhance resistance to oxidation and to increase electrical conductivity. Sources of oxygen include oxygen gas ($O_2$), water vapor, ethanol, and hydrogen peroxide. Sources of silicon preferably include silanes such as $SiH_4$, $Si_2H_6$, and hexamethyldisiloxane. Sources of nitrogen include nitrogen gas ($N_2$), ammonia ($NH_3$), and hydrazine ($N_2H_6$).

The additives may be incorporated into the diamond-like matrix or attached to the surface atomic layer. If the additives are incorporated into the diamond-like matrix they may cause perturbations in the density and/or structure, but the resulting material is essentially a densely packed network with diamond-like carbon characteristics (chemical inertness, hardness, barrier properties, etc.). If the additive concentration is large, greater than 50 atomic percent relative to the carbon concentration, the density will be affected and the beneficial properties of the diamond-like carbon network will be lost. If the additives are attached to the surface atomic layers they will alter only the surface structure and properties. The bulk properties of the diamond-like carbon network will be preserved.

Polymer Layers

The polymer layers used in the multilayer stack of the barrier assemblies are preferably crosslinkable. The crosslinked polymeric layer lies atop the substrate or other layers, and it can be formed from a variety of materials. Preferably the polymeric layer is crosslinked in situ atop the underlying layer. If desired, the polymeric layer can be applied using conventional coating methods such as roll coating (e.g., gravure roll coating) or spray coating (e.g., electrostatic spray coating), then crosslinked using, for example, ultraviolet (UV) radiation. Most preferably the polymeric layer is formed by flash evaporation, vapor deposition and crosslinking of a monomer as described above. Volatilizable (meth)acrylate monomers are preferred for use in such a process, with volatilizable acrylate monomers being especially preferred. Preferred (meth)acrylates have a molecular weight in the range of about 150 to about 600, more preferably about 200 to about 400. Other preferred (meth)acrylates have a value of the ratio of the molecular weight to the number of acrylate functional groups per molecule in the range of about 150 to about 600 g/mole/(meth)acrylate group, more preferably about 200 to about 400 g/mole/(meth)acrylate group. Fluorinated (meth)acrylates can be used at higher molecular weight ranges or ratios, e.g., about 400 to about 3000 molecular weight or about 400 to about 3000 g/mole/(meth)acrylate group. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof.

The physical thickness of the crosslinked polymeric layer will depend in part upon its refractive index and in part upon the desired optical characteristics of the film (e.g., on whether the film should contain a Fabry-Perot stack). For use in an infrared-rejecting Fabry-Perot stack, the crosslinked polymeric spacing layer typically will have a refractive index of about 1.3 to about 1.7, and preferably will have an optical thickness of about 75 nm to about 200 nm, more preferably about 100 nm to about 150 nm and a corresponding physical thickness of about 50 nm to about 130 nm, more preferably about 65 nm to about 100 nm.

Alternative materials for the polymer layers include materials having a Tg greater than or equal to that of HSPET. A variety of alternative polymer materials can be employed. Volatilizable monomers that form suitably high Tg polymers are especially preferred. Preferably the alternative polymer layer has a Tg greater than that of PMMA, more preferably a Tg of at least about 110° C., yet more preferably at least about 150° C., and most preferably at least about 200° C. Especially preferred monomers that can be used to form this layer include urethane acrylates (e.g., CN-968, Tg=about 84° C. and CN-983, Tg=about 90° C., both commercially available from Sartomer Co.), isobornyl acrylate (e.g., SR-506, commercially available from Sartomer Co., Tg=about 88° C.), dipentaerythritol pentaacrylates (e.g., SR-399, commercially available from Sartomer Co., Tg=about 90° C.), epoxy acrylates blended with styrene (e.g., CN-120S80, commercially available from Sartomer Co., Tg=about 95° C.), di-trimethylolpropane tetraacrylates (e.g., SR-355, commercially available from Sartomer Co., Tg=about 98° C.), diethylene glycol diacrylates (e.g., SR-230, commercially available from Sartomer Co., Tg=about 100° C.), 1,3-butylene glycol diacrylate (e.g., SR-212, commercially available from Sartomer Co., Tg=about 101° C.), pentaacrylate esters (e.g., SR-9041, commercially available from Sartomer Co., Tg=about 102° C.), pentaerythritol tetraacrylates (e.g., SR-295, commercially available from Sartomer Co., Tg=about 103° C.), pentaerythritol triacrylates (e.g., SR-444, commercially available from Sartomer Co., Tg=about 103° C.), ethoxylated (3) trimethylolpropane triacrylates (e.g., SR-454, commercially available from Sartomer Co., Tg=about 103° C.), ethoxylated (3) trimethylolpropane triacrylates (e.g., SR-454HP, commercially available from Sartomer Co., Tg=about 103° C.), alkoxylated trifunctional acrylate esters (e.g., SR-9008, commercially available from Sartomer Co., Tg=about 103° C.), dipropylene glycol diacrylates (e.g., SR-508, commercially available from Sartomer Co., Tg=about 104° C.), neopentyl glycol diacrylates (e.g., SR-247, commercially available from Sartomer Co., Tg=about 107° C.), ethoxylated (4) bisphenol a dimethacrylates (e.g., CD-450, commercially available from Sartomer Co., Tg=about 108° C.), cyclohexane dimethanol diacrylate esters (e.g., CD-406, commercially available from Sartomer Co., Tg=about 110° C.), isobornyl methacrylate (e.g., SR-423, commercially available from Sartomer Co., Tg=about 110° C.), cyclic diacrylates (e.g., IRR-214, commercially available from UCB Chemicals, Tg=about 208° C.) and tris (2-hydroxy ethyl) isocyanurate triacrylate (e.g., SR-368, commercially available from Sartomer Co., Tg=about 272° C.), acrylates of the foregoing methacrylates and methacrylates of the foregoing acrylates.

Other Optional Layers, Coatings, and Treatments

Various functional layers or coatings can be added to the barrier assemblies to alter or improve their physical or chemical properties, particularly at the surface of the barrier film. Such layers or coatings can include, for example, visible light-transmissive conductive layers or electrodes (e.g., of indium tin oxide); antistatic coatings or films; flame retardants; UV stabilizers; abrasion resistant or hardcoat materials; optical coatings; anti-fogging materials; magnetic or magneto-optic coatings or films; photographic emulsions; prismatic films; holographic films or images; adhesives such as pressure sensitive adhesives or hot melt adhesives; primers to promote adhesion to adjacent layers; and low adhesion backsize materials for use when the barrier assembly is to be used in adhesive roll form. These functional components can be incorporated into one or more of the outermost layers of the barrier assembly or can be applied as a separate film or coating.

Optional layers can also include "getter" or "desiccant" layers functionally incorporated within or adjacent to the barrier coating; examples of such layers are described in copending U.S. patent application Ser. Nos. 10/948,013 and 10/948,011, which are incorporated herein by reference as if fully set forth. Getter layers include layers with materials that absorb or deactivate oxygen, and desiccant layers include layers with materials that absorb or deactivate water.

Other optional layers include one or more inorganic barrier layers. The inorganic barrier layers, when multiple such layers are used, do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers, when incorporated into the assembly, preferably are formed using techniques employed in the film metallizing art such as sputtering (e.g., cathode or planar magnetron sputtering), evaporation (e.g., resistive or electron beam evaporation), chemical vapor deposition, plating and the like. Most preferably the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. Without being bound by theory, it is believed that the enhanced properties are due to the condensing species arriving at the substrate with greater kinetic energy, leading to a lower void fraction as a result of compaction. The smoothness and continuity of each inorganic barrier layer and its adhesion to the underlying layer can be enhanced by pretreatments (e.g., plasma pretreatment) such as those described above.

For some applications, it may be desirable to alter the appearance or performance of the barrier assembly, such as by laminating a dyed film layer to the barrier assembly, applying a pigmented coating to the surface of the barrier assembly, or including a dye or pigment in one or more of the materials used to make the barrier assembly. The dye or pigment can absorb in one or more selected regions of the spectrum, including portions of the infrared, ultraviolet or visible spectrum. The dye or pigment can be used to complement the properties of the barrier assembly, particularly where the barrier assembly transmits some frequencies while reflecting others.

The barrier assembly can be treated with, for example, inks or other printed indicia such as those used to display product identification, orientation information, advertisements, warnings, decoration, or other information. Various techniques can be used to print on the barrier assembly, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

The barrier assemblies can also have a protective polymer topcoat. If desired, the topcoat polymer layer can be applied using conventional coating methods such as roll coating (e.g., gravure roll coating) or spray coating (e.g., electrostatic spray coating), then crosslinked using, for example, UV radiation. A pretreatment (e.g., plasma pretreatment) may be used prior to formation of the topcoat polymer layer. The desired chemical composition and thickness of the topcoat polymer layer will depend in part on the nature and surface topography of the underlying layer(s), the hazards to which the barrier assembly might be exposed, and applicable device requirements. The topcoat polymer layer thickness preferably is sufficient to provide a smooth, defect-free surface that will protect the underlying layers from ordinary hazards.

General Techniques for Coating of Layers

The polymer layers can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The polymer layers can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the polymer layers are formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

Manufacturing Process

Figure 4:
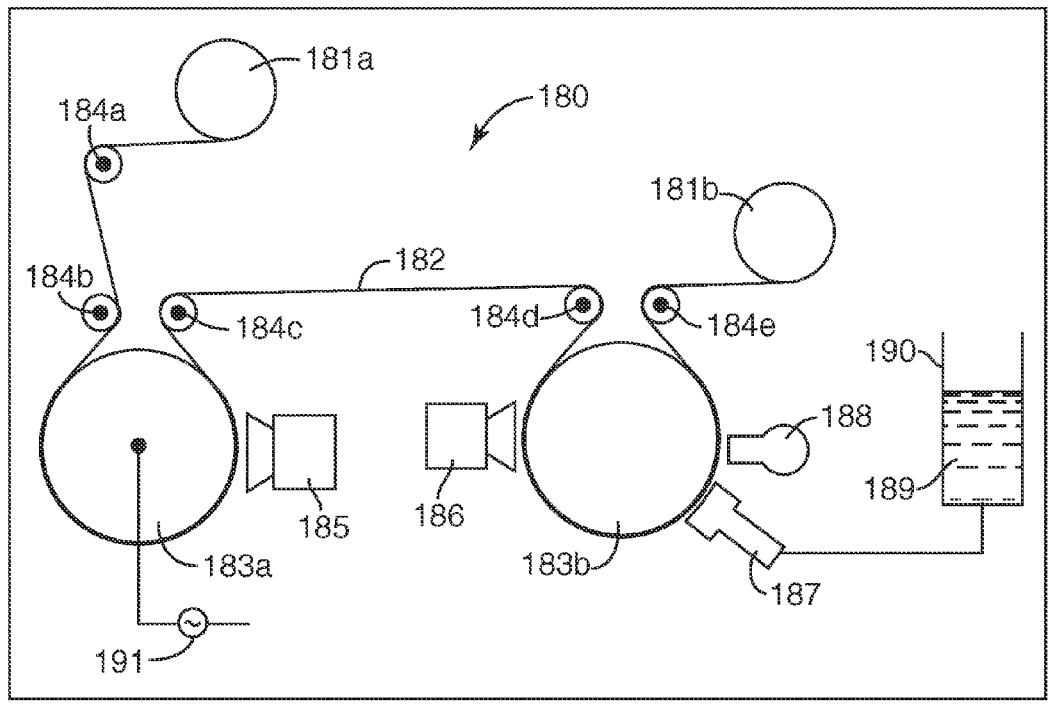
FIG. 4 is a schematic view of an apparatus for carrying out a disclosed process for making barrier assemblies.

FIG. 4 illustrates a preferred apparatus 180 that can be used for roll-to-roll manufacture of barrier assemblies on the invention, such as those shown in FIGS. 1-3 and described above. A more detailed diagram and description of a vacuum system used to make the barrier coatings is shown in U.S. Pat. No. 5,888,594, incorporated herein by reference. Powered rolls 181a and 181b move supporting web 182 back and forth through apparatus 180. Temperature-controlled rotating drums 183a and 183b, and idler rolls 184a, 184b, 184c, 184d and 184e carry web 182 past metal sputtering applicator 185, plasma pretreater 186, monomer evaporator 187 and E-beam crosslinking device 188. Liquid material 189 is supplied to evaporator 187 from reservoir 190. Successive layers or pairs of layers can be applied to web 182 using multiple passes through apparatus 180. Additional applicators, pretreaters, evaporators and crosslinking devices can be added to apparatus 180, for example along the periphery of drums 183a and 183b, to enable sequential deposition of several pairs of layers. A power source 191 can provide the appropriate bias to drum 183a. Apparatus 180 can be enclosed in a suitable chamber (as represented by the box enclosing it) and maintained under vacuum or supplied with a suitable inert atmosphere in order to discourage oxygen, water vapor, dust and other atmospheric contaminants from interfering with the various pretreatment, monomer coating, crosslinking and sputtering steps. Also, apparatus 180 can alternatively use only one drum 183a for coating web 182, along the appropriate elements for applying layers to the web.

Display Device with Barrier

Figure 5:
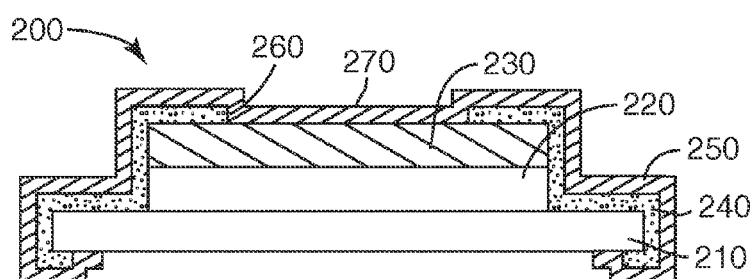
FIG. 5 is a schematic cross-sectional view of an exemplary OLED device that can incorporate the barrier assembly.

FIG. 5 is a schematic cross-sectional view of a disclosed OLED device. The barrier assemblies of the invention, such as those shown in FIGS. 1-3 and described above, can be used to inhibit the transmission of moisture vapor, oxygen or other gases in a variety of applications. The barrier assemblies are especially useful for encapsulating OLEDs, light valves such as LCDs, and other electronic devices, aside from the other examples provided above. A representative encapsulated OLED device 200 is shown in FIG. 5. The front or light-emitting side of device 200 faces downward in FIG. 5. Device 200 includes a visible light-transmissive barrier assembly 210 having an outer indium tin oxide layer (not shown in FIG. 5, but oriented so that it would face upward) that serves as an anode.

Light emitting structure 220 is formed on barrier assembly 210 in contact with the outer ITO layer. Structure 220 contains a plurality of layers (not individually shown in FIG. 5) that cooperate to emit light downward through barrier assembly 210 when suitably electrically energized. Device 200 also includes conductive cathode 230 and metallic foil surround 250. Foil surround 250 is adhered to the back, sides and part of the front of device 220 by adhesive 240. An opening 260 formed in adhesive 240 permits a portion 270 of foil 250 to be deformed into contact with cathode 230. Another opening in foil 250 (not shown in FIG. 5) permits contact to be made with the anode formed by the outer ITO layer of barrier assembly 210. Metal foil 250 and barrier assembly 210 largely prevent water vapor and oxygen from reaching light emitting structure 220.

The invention will now be described with reference to the following non-limiting examples.

EXAMPLE 1

A UV-curable polymer solution was made containing 100 grams of epoxy acrylate, commercially available from UCB Chemicals, Smyrna, Ga. under the trade designation "Ebecryl 629"; 2 grams of 1-hydroxy-cyclohexyl-phenyl ketone, commercially available from Ciba Specialty Chemicals, Tarrytown, N.Y. under the trade designation "Irgacure184" dissolved in 1000 grams of methyl ethyl ketone. The resulting solution was coated at a web speed of 20 ft/min on a 6.5 inch wide, 100 micron polyethylene terephthalate ("PET") liner commercially available from Teijin Corp., Japan under the trade designation "HSPE 100" using a microgravure coater commercially available from Yasui Seiki, Japan under the trade designation "Model CAG150" fitted with a 90R knurl. The coating was dried in-line at 70° C. and cured under a nitrogen atmosphere with UV lamp commercially available from Fusion UV systems, Gaithersburg, Md. under the trade designation "F-600 Fusion D UV lamp" operating at 100% power, resulting in a dried coating thickness of approximately 1.2 microns.

The polymer coated web described above was loaded into the vacuum chamber of the coating system used to make DLG coating shown in U.S. Pat. No. 5,888,594 and pumped down to approximately 1 mTorr. The reactive gases were introduced into the chamber and RF power was applied to the drum. The web speed was adjusted to achieve the desired coating thickness. A second polymer layer was coated over the first DLG coating according to same conditions as the first polymer layer except a 110R knurl was used which resulted in the polymer layer thickness of approximately 0.7 microns. Table 2 describes the deposition conditions for DLG coating and the MVTR of the resulting barrier coatings that were made in this chamber.

Barrier coatings were also made using reactive sputtering process for comparison purposes. PET web coated with the first polymer layer was coated with SiOx coating deposited under conditions shown in Table 3. A second polymer layer was coated over the first SiOx layer and a second SiOx layer was then coated over the second polymer layer. The deposition conditions and MVTR of coatings made by the reactive sputtering process are listed in Table 3.

TABLE 2

Deposition conditions used to make barrier coatings and their MVTRs

| Sample # | TMS Sccm | $O_2$ sccm | Deposition Time seconds | Pressure mTorr | Thickness nm | Substrate Bias Volts | MVTR $g/m^2$ day |
|---|---|---|---|---|---|---|---|
| 1 | 180 | 200 | 51 | 6 | 100 | −805 | 0.017 |
| 2 | 180 | 200 | 90 | 6 | 175 | −805 | <0.005 * |

* MVTR @ 50° C./100% RH = 0.008 $g/m^2$ day

TABLE 3

Comparative example: Barrier films made using reactive sputtering process

| Sample # | Argon Sccm | $O_2$ sccm | Web Speed fpm | Pressure mTorr | Coating Thickness nm | Power Watts | Target Voltage Volts | MVTR $g/m^2$ day |
|---|---|---|---|---|---|---|---|---|
| 1 | 51 | 27 | 1.4 | 1 | 60 | 2000 | −600 | 0.028 |
| 2 | 51 | 31 | 1.7 | 3 | 100 | 4000 | −620 | 0.095 |

EXAMPLE 2

The effect of the diamond-like film deposition conditions was established by depositing a two-dyad stack of solution coated acrylate and a diamond-like film. In particular, referring to FIG. 2, the sample analyzed included a PET substrate 112, acrylate layers 114 and 118, and DLG film layers 116 and 120. The process for coating the acrylate layers is described in Example 1.

The primary variables explored in the study of the sample were as follows: (1) tetramethylsilane (TMS)/oxygen ratio and plasma power; (2) plasma power; and (3) deposition time (thickness) of the DLG film.

Sixteen different conditions were studied as shown in Table 4 below, and the moisture barrier properties of these films was measured for each of these conditions at 50° C. The MVTR values are shown in the last column in Table 4 below. From these results, it may be seen that there were several conditions that yield MVTR values that are at or below the detection limit of the Mocon tester at 50° C. Additional significant points were as follows. For a fixed value of the TMS/$O_2$ ratio and power, the MVTR values decrease with increasing thickness of the diamond-like film. For any fixed value of power, the MVTR values are lower at a TMS/$O_2$ ratio of 1.0 when compared to 0.25. This means that the films with more organic content had improved barrier performance. For any fixed value of TMS/$O_2$ ratio and thickness, the MVTR values were slightly higher for the 2000 watts compared to 1000 watts of plasma power.

TABLE 4

| RunOrder | TMS/$O_2$ | Pressure (mTorr) | Power (W) | Time (sec) | $O_2$ sccm | TMS sccm | DC Bias V | MVTR@ 50° C. (g/($m^2$day)) |
|---|---|---|---|---|---|---|---|---|
| 020-02 | 1 | 7 | 1000 | 30 | 200 | 200 | −763 | 0.02 |
| 020-03 | 1 | 7 | 1000 | 60 | 200 | 200 | −763 | 0.005 |
| 020-04 | 1 | 7 | 1000 | 90 | 200 | 200 | −763 | 0.005 |
| 020-01 | 1 | 7 | 1000 | 120 | 200 | 200 | −763 | <0.005 |
| 020-06 | 0.25 | 7 | 1000 | 30 | 320 | 80 | −748 | 0.043 |
| 020-07 | 0.25 | 7 | 1000 | 60 | 320 | 80 | −748 | 0.025 |
| 020-08 | 0.25 | 7 | 1000 | 90 | 320 | 80 | −748 | 0.016 |
| 020-05 | 0.25 | 7 | 1000 | 120 | 320 | 80 | −748 | 0.005 |
| 020-10 | 1 | 7 | 2000 | 30 | 200 | 200 | −1107 | 0.017 |
| 020-11 | 1 | 7 | 2000 | 60 | 200 | 200 | −1107 | 0.005 |
| 020-12 | 1 | 7 | 2000 | 90 | 200 | 200 | −1107 | <0.005 |
| 020-09 | 1 | 7 | 2000 | 120 | 200 | 200 | −1107 | <0.005 |
| 020-14 | 0.25 | 7 | 2000 | 30 | 320 | 80 | −1059 | 0.076 |
| 020-15 | 0.25 | 7 | 2000 | 60 | 320 | 80 | −1059 | 0.062 |
| 020-16 | 0.25 | 7 | 2000 | 90 | 320 | 80 | −1059 | 0.012 |
| 020-13 | 0.25 | 7 | 2000 | 120 | 320 | 80 | −1059 | <0.005 |

The invention claimed is:

1. A single dyad barrier film, consisting of layers arranged in the following order:
    a flexible substrate;
    a layer of a polymeric material applied to the substrate; and
    a layer of diamond-like glass material applied to the polymeric material,
    wherein the diamond-like glass material comprises a random covalent network containing carbon, silicon, and oxygen,
    wherein the layer of diamond-like glass material has a thickness less than or equal to 1.0 micron.

2. The barrier film of claim 1, wherein the diamond-like glass material has a thickness less than or equal to 0.2 microns.

3. The barrier film of claim 1, wherein the substrate has a thickness less than or equal to 0.5 millimeters.

4. The barrier film of claim 1, wherein the substrate comprises a visible light-transmissive support.

5. The barrier film of claim 1, wherein the polymeric material has a thickness less than or equal to 10 microns.

6. The barrier film of claim 1, having a moisture vapor transmission rate that does not exceed 0.05 g/m$^2$ day.

7. A single dyad barrier film, consisting of layers arranged in the following order:
- a flexible substrate;
- a layer of a polymeric material applied to the substrate;
- a layer of diamond-like glass material applied to the polymeric material,
  wherein the diamond-like glass material comprises a random covalent network containing carbon, silicon, and oxygen,
  wherein the layer of diamond-like glass material has a thickness less than or equal to 1.0 micron; and
- a functional layer applied to the substrate on a side of the substrate opposite the layer of the polymeric material.

8. The barrier film of claim 7, wherein the functional layer comprises an abrasion resistant or hardcoat material.

9. The barrier film of claim 7, wherein the functional layer comprises an antistatic coating or film.

10. The barrier film of claim 7, wherein the functional layer comprises an optical coating.

11. The barrier film of claim 7, wherein the functional layer comprises a visible light-transmissive conductive layer or electrode.

12. The barrier film of claim 7, wherein the functional layer comprises an adhesive.

13. The barrier film of claim 7, wherein the functional layer comprises a primer to promote adhesion to adjacent layers.

14. The barrier film of claim 7, wherein the functional layer comprises a UV stabilizer.

15. The barrier film of claim 7, wherein the diamond-like glass material has a thickness less than or equal to 0.2 microns.

16. The barrier film of claim 7, wherein the substrate has a thickness less than or equal to 0.5 millimeters.

17. The barrier film of claim 7, wherein the substrate comprises a visible light-transmissive support.

18. The barrier film of claim 7, wherein the polymeric material has a thickness less than or equal to 10 microns.

19. The barrier film of claim 7, having a moisture vapor transmission rate that does not exceed 0.05 g/m$^2$ day.

20. A single dyad barrier film, consisting of layers arranged in the following order:
- a flexible substrate;
- a layer of a polymeric material applied to the substrate;
- a layer of diamond-like glass material applied to the polymeric material,
  wherein the diamond-like glass material comprises a random covalent network containing carbon, silicon, and oxygen,
  wherein the layer of diamond-like glass material has a thickness less than or equal to 1.0 micron; and
- a getter or desiccant layer adjacent the layer of the diamond-like glass material.

21. The barrier film of claim 20, wherein the diamond-like glass material has a thickness less than or equal to 0.2 microns.

22. The barrier film of claim 20, wherein the substrate has a thickness less than or equal to 0.5 millimeters.

23. The barrier film of claim 20, wherein the substrate comprises a visible light-transmissive support.

24. The barrier film of claim 20, wherein the polymeric material has a thickness less than or equal to 10 microns.

25. The barrier film of claim 20, having a moisture vapor transmission rate that does not exceed 0.05 g/m$^2$ day.

* * * * *